United States Patent [19]

Uehara et al.

[11] Patent Number: 4,550,239

[45] Date of Patent: Oct. 29, 1985

[54] AUTOMATIC PLASMA PROCESSING DEVICE AND HEAT TREATMENT DEVICE

[75] Inventors: Akira Uehara, Kanagawa; Isamu Hijikata, Tokyo; Hisashi Nakane, Kanagawa; Muneo Nakayama, Tokyo, all of Japan

[73] Assignee: Tokyo Denshi Kagaku Kabushiki Kaisha, Kanagawa, Japan

[21] Appl. No.: 424,503

[22] Filed: Sep. 27, 1982

[30] Foreign Application Priority Data

Oct. 5, 1981 [JP] Japan .................................. 56-159281
Aug. 27, 1982 [JP] Japan .................................. 57-148583

[51] Int. Cl.⁴ ........................... B23K 9/00; C23C 15/00
[52] U.S. Cl. ........................ 219/121 PG; 219/121 PD; 219/121 PX; 156/345; 414/217; 414/331; 414/404
[58] Field of Search ............. 219/121 PD, 121 PE, 219/121 PG, 121 PF, 158, 159; 204/192 E, 164; 156/643, 345, 646; 414/416, 417, 404, 217, 331

[56] References Cited

U.S. PATENT DOCUMENTS

| | | | |
|---|---|---|---|
| 3,902,615 | 9/1975 | Levy et al. ............................ | 414/416 |
| 4,151,034 | 4/1979 | Yamamoto et al. ......... | 219/121 PG |
| 4,201,579 | 5/1980 | Robinson et al. .................... | 156/345 |
| 4,303,467 | 12/1981 | Scornavacca et al. ............. | 156/345 |
| 4,304,983 | 12/1981 | Pierfederici .................. | 219/121 PG |
| 4,311,427 | 1/1982 | Coad et al. ........................... | 414/417 |
| 4,336,438 | 6/1982 | Uehara et al. ................ | 219/121 PG |
| 4,345,968 | 8/1982 | Coe ..................................... | 156/627 |
| 4,412,771 | 11/1983 | Gerlach et al. ..................... | 414/222 |

Primary Examiner—M. H. Paschall
Attorney, Agent, or Firm—Irving M. Weiner; Joseph P. Carrier; John J. Cantarella

[57] ABSTRACT

An automatic plasma processing device having a substantially vertically disposed plasma chamber in which a plurality of semiconductor wafers can be simultaneously processed with plasma. The automatic plasma processing device comprises a container cassette adapted to contain a plurality of wafers therein, a feeding mechanism for taking out the wafers one by one from the cassette and for feeding the same, a holding frame for receiving the wafers one by one from the feeding mechanism and for holding the same therein, a driving mechanism for moving the holding frame up and down into and out of the plasma chamber, a plasma generating mechanism for generating plasma in the plasma chamber, and a control system for controlling the aforesaid mechanisms. The device is simplified in construction and can automatically and successively process a large number of wafers, while at the same time having a compact construction.

17 Claims, 4 Drawing Figures

AUTOMATIC PLASMA PROCESSING DEVICE AND HEAT TREATMENT DEVICE

BACKGROUND OF THE INVENTION

1. Field of the Invention

The present invention relates generally to an automatic plasma processing device. More particularly, the invention relates to a vertical automatic plasma processing device having a vertically disposed plasma generating chamber which is employed for etching and cleaning of semiconductor wafers as intermediate products during production of chips having large scale integrated circuits such as LSI's and VLSI's formed thereon, for ashing of photoresist layers on surfaces of such wafers, etc.

2. Description of Relevant Art

Normally, production of chips having a large scale integrated circuit such as an LSI formed thereon necessarily includes a process of etching an insulator film, a semiconductor film or a metal film through a photoresist film having a fine pattern formed on a semiconductor wafer, another process of cleaning such films, and a process of ashing to remove the remaining photoresist film used for the etching from the surface of the wafer.

Conventionally, the aforesaid processes are effected by a wet type processing in which various liquid chemicals such as inorganic acids, organic solvents, etc., are employed. However, in addition to the problem of disposition of waste liquids, working accuracy is low.

Recently, patterns formed on chips have had a tendency to become finer and finer with the development of VLSI's. Accordingly, the aforesaid conventional wet type processing becomes more and more difficult to apply to production of the VLSI's.

In view of the foregoing, application of a dry type processing wherein plasma is employed is presently increasing due to the working accuracy thereof. Thus, various plasma processing devices for effecting a dry type processing have been proposed. However, most of such plasma processing devices include only a plasma generating chamber. Therefore, wafers must be loaded into and unloaded from the plasma generating chamber by manual operations exclusively. For example, wafers are taken out one by one from an unprocessed wafer containing cassette and are transferred one by one to a wafer jig made of quartz or aluminum using a pair of tweezers. Consequently, the percentage of available products is very low due to breaks and cracks of the wafers, dropping and contamination of wafers from incomplete clamping of same, etc. Such defects become more material as the diameter of the wafers becomes larger, e.g., recently to five inches and even to six inches. Further, because the wafers are heated to a high temperature during plasma processing, manual operations to remove the wafers after completion of the processing must be avoided, resulting in an extremely low working efficiency.

An example of an automatic plasma processing device which eliminates the foregoing disadvantages is disclosed in Japanese Laid-Open Pat. No. 53-90870. The disclosed device, however, is extremely complicated in structure and includes a horizontally disposed plasma generating chamber. Accordingly, a large floor area is occupied by the device as a whole, and the device cannot be made compact.

The present invention effectively overcomes the foregoing problems attendant conventional techniques as described hereinabove.

SUMMARY OF THE INVENTION

The present invention provides an automatic plasma processing device, comprising: at least one cassette member adapted to contain a plurality of semiconductor wafers therein; a feeding mechanism for taking out the wafers one by one from the cassette member and for feeding the same; a holding member operable for receiving the wafers one by one from the feeding mechanism and for holding a plurality of such wafers therein; a driving mechanism for driving the holding member to move in a substantially vertical direction; a plasma chamber disposed in a substantially vertical direction such that the holding member may be moved in the vertical direction into and out of the plasma chamber; a plasma generating mechanism for generating plasma in the plasma chamber in order to effect plasma processing of the wafers with the plasma thus generated; and a control system for controlling the feeding mechanism, the driving mechanism and the plasma generating mechanism in accordance with a predetermined sequence.

It is an object of the present invention to provide a vertically disposed automatic plasma processing device of a simplified construction which automatically and successively processes a large number of wafers at the same time, and which is compact.

The above and further objects, details and advantages of the present invention will become apparent from the following detailed description when read in conjunction with the accompanying drawings.

DETAILED DESCRIPTION OF PREFERRED EMBODIMENTS

Figure 1:
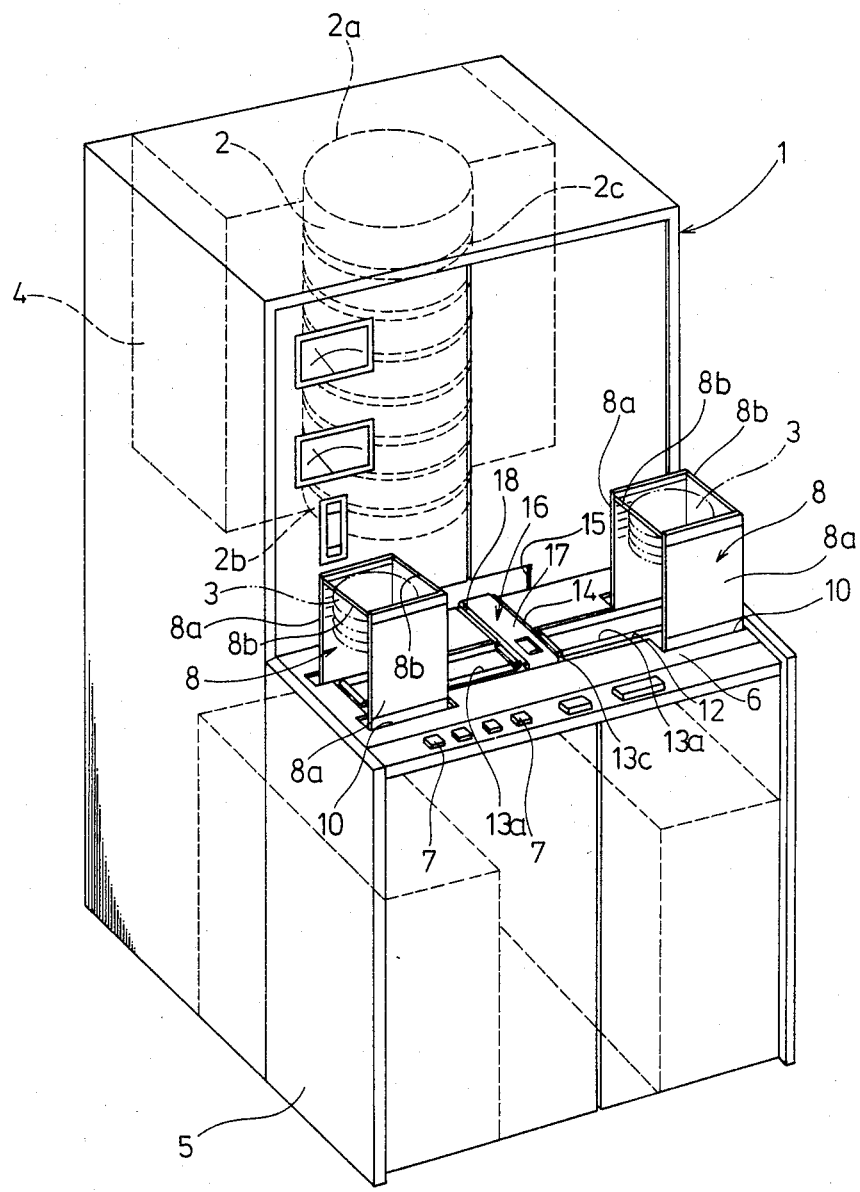
FIG. 1 is a general perspective view of an automatic plasma processing device according to the present invention.
Figure 2:
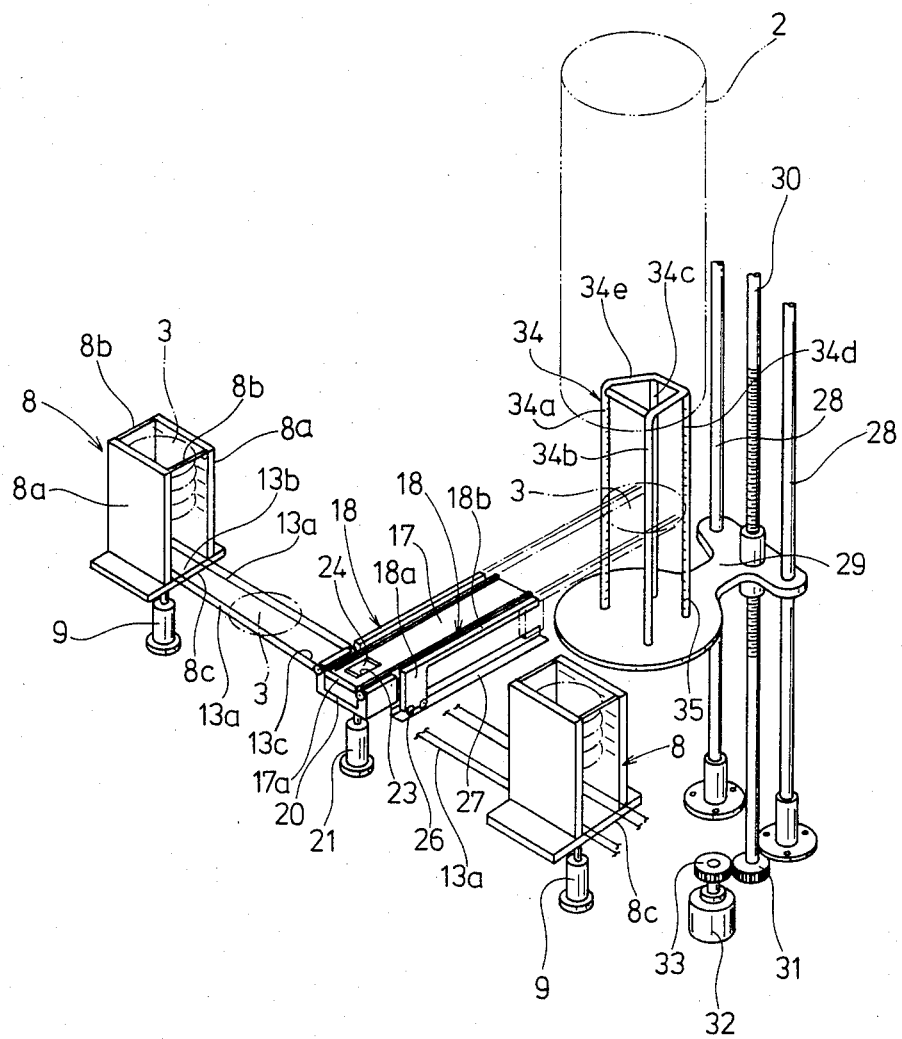
FIG. 2 is a perspective view showing an inside structure of the device of FIG. 1.

With reference to FIGS. 1 and 2, there is shown an automatic heat treatment or plasma processing device which includes a body 1 substantially in the form of a box. The device body 1 has a substantially cylindrical treatment chamber or plasma generating chamber 2 made of quartz disposed therein in a substantially vertical direction or in a direction in which it has a substantially vertical axis. The chamber 2 is closed at the top end 2a thereof and is open at the lower end 2b thereof (i.e., it is downwardly opening) in order to allow semiconductor wafers 3 to be loaded into and unloaded from the chamber 2 through the opening. A plasma generating and heating mechanism including an electrode plate (not shown) and a heating coil 2c, such as a high-frequency inductive heating coil is provided around an outer periphery of the chamber 2 and a high frequency voltage is applied thereto from a high frequency power source 4 provided in the body 1. If desired, a resistance heating coil or a heating lamp can alternatively be employed as a heating means.

The device body 1 has an extruding portion or apron 5 provided at a front lower half portion thereof. Several operating buttons 7 are disposed on an upper wall of the apron 5 and a pair of container cassettes 8 adapted to contain therein a plurality of sheet-like treatment objects such as semiconductor wafers 3 (up to 25 wafers in the present embodiment) are also provided at opposite ends of the upper wall 6 of the apron 5. Each container cassette 8 includes a pair of plate members 8a made of a material such as aluminum, Teflon, or the like, and a pair of bar members 8b which connect the top ends of the plate members 8a to each other. As shown in FIG. 2, the cassette 8 also includes a bottom plate 8c connecting the bottom ends of the plate members 8a and is supported at the bottom plate 8c thereof on a supporting mechanism 9 for up and down movement such that, when the supporting mechanism 9 moves up or down, it is lifted from or lowered into the apron 5 through one of openings 10 provided at opposite left and right ends of the top wall 6 of the apron 5.

Figure 3:
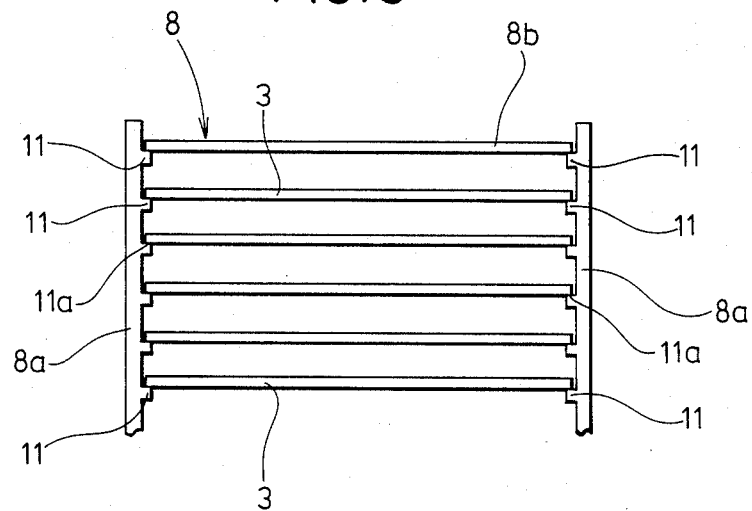
FIG. 3 is a side elevational view showing part of a wafer container cassette.

As shown in FIG. 3, each of the plate members 8a of the container cassette 8 has a required number of substantially horizontal parallel ribs 11 formed in an equidistant relationship on an inner surface thereof so that a wafer 3 may be supported at opposite ends thereof on shoulders 11a of a pair of opposing ribs 11 of the two plate members 8a.

Referring again to FIG. 1, the upper wall 6 of the apron 5 has another opening 12 formed at a mid portion thereof which extends in a substantially leftward and rightward direction to the aforementioned openings 10. A pair of first feeding mechanisms 13 are disposed in the opening 12 and are adapted to carry in and out or load and unload wafers 3. Each feeding mechanism 13 includes a pair of front and rear endless belts 13a as shown in FIG. 2. A base end portion 13b of each endless belt 13a is disposed below the corresponding container cassette 8 while the opposite end portions 13c of the left and right endless belts 13a on the front and rear sides are opposed in a mutually spaced relationship at the central part of the upper wall 6 of the apron 5. It is to be noted that an upper span of each endless belt 13a is positioned slightly above the upper wall 6 of the apron 5 so that the endless belt 13a may receive thereon one of the wafers 3 which is currently located at a lowermost position when the corresponding container cassette 8 is in its lowered position.

As shown in FIG. 1, the upper wall 6 of the apron 5 has a further opening 14 formed therein which is continuous with the opening 12 and extends rearwardly therefrom. A second feeding mechanism 16 is provided in the opening 14 and feeds wafers 3 from the first feeding mechanisms 13 to the chamber 2 and vice versa through an opening 15 which is formed at a central part of a front wall of the body 1.

Figure 4:
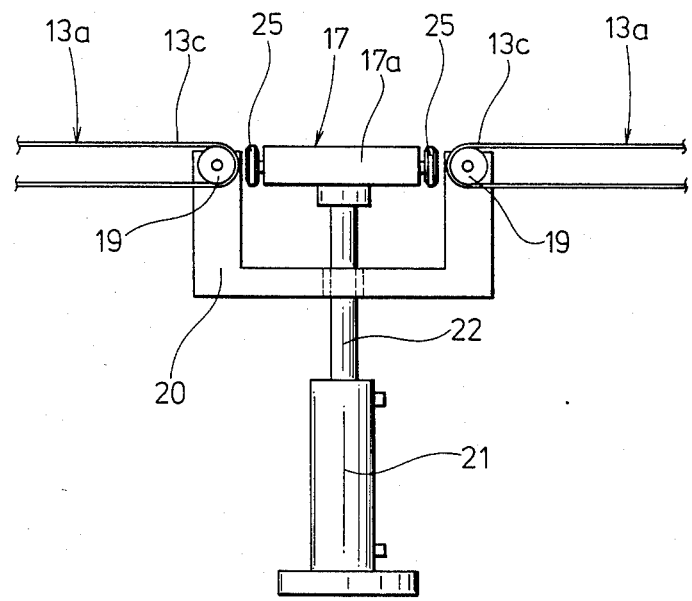
FIG. 4 is a front elevational view showing an essential part of a wafer feeding mechanism.

The second feeding mechanism 16 includes a lift member 17 extending in the forward and rearward direction and mounted for movement in a vertical direction, and a pair of left and right arm members 18 extending and mounted for movement in the forward and rearward direction. The lift member 17 is formed substantially in the shape of a plate and has its base end 17a disposed in a channel-shaped support block 20 which supports thereon pulleys 19 around which end portions 13c of the opposed endless belts 13a of the first feeding mechanisms 13 extend, as shown in FIG. 4. The lift member 17 is secured at the bottom thereof to a piston rod 22 of a cylinder unit 21 disposed below the support block 20 so that it is moved up and down by upward and downward movement of the cylinder unit 21. It is to be understood that, when the rod 22 is in a contracted position, the top of the lift member 17 is disposed slightly below upper spans of the endless belts 13a of the first feeding mechanisms 13. The lift member 17 has a window 23 formed at the base end 17a thereof as shown in FIG. 2. A roller 24 is loosely fitted in the window 23 for rotation in opposite directions in order to facilitate transfer to the lift member 17 of a wafer 3 fed thereto.

A pair of endless belts 25 as shown in FIG. 4 are provided on opposite left and right sides of the lift member 17 in order to feed a wafer 3 forwardly and rearwardly along the lift member 17.

The aforesaid arm members 18 are disposed outside and adjacent the endless belts 25. As shown in FIG. 2, each arm member 18 has a base end portion 18a having a rectangular configuration and a bar portion 18b extending rearwardly from an upper end of the base end portion 18a, and also has casters 26 mounted at a lower end of the base end portion 18a so that the arm member 18 may be moved on and along a guide rail 27 which is mounted to extend in the forward and rearward direction.

Referring again to FIG. 2, two guide bars 28 are erected on a bottom wall of the body 1 and a bottom lid member 29 of the aforesaid plasma generating chamber 2 is mounted for sliding movement on the guide bars 28. A rod 30 having a thread formed thereon extends through and is in threaded engagement with the lid member 29. The rod 30 has a gear 31 mounted at a lower end thereof which is in meshing engagement with another gear 33 of a motor 32 securely mounted on the bottom wall of the body 1. Thus, upon energization of the motor 32, the lid member 29 is moved up or down along the guide bars 28.

A wafer holding frame 34 is mounted on an upper face of the lid member 29 and presents, as viewed from above, a substantially trapezoidal configuration wherein the front side of the frame 34 forms the bottom side of the trapezoid. The wafer holding frame 34 includes four rods 34a, 34b, 34c and 34d, and a member 34e connecting the top ends of adjacent ones of the rods 34a, 34b, 34c and 34d to each other. The rods 34a and 34b are at opposite ends of the bottom side of the aforesaid trapezoid while the rods 34c and 34d are at opposite ends of the top side of the trapezoid. Each rod 34a, 34b, 34c or 34d has a plurality of grooves or slits 35 (up to 50 slits in the present embodiment) formed in an equidistantly spaced relationship in a vertical row along an inner side thereof such that end portions of wafers 3 may be engaged in slits 35. Thus, a wafer 3 will be held by the wafer holding frame 34 by feeding the wafer 3 placed between end portions of the arm members 18 into the wafer holding frame 34 by rearward movement of the arm members 18 to a position in which it is engaged at various portions thereof in corresponding slits 35 of the rods 34a, 34b, 34c and 34d.

The vertical automatic plasma device having a structure as described hereinabove operates in the following manner.

First, the left-hand side cassette 8 which contains up to 25 wafers 3 therein is moved down by a small distance until a lowermost one of the wafers 3 is received by the left-hand side first feeding mechanism 13. The lowermost wafer 3 is then fed by means of the pair of endless belts 13a to the end portions 13c of the endless belts 13a and is there transferred to the lift member 17 which constitutes part of the second feeding mechanism 16, whereupon the cylinder unit 21 is brought into operation by means of a limit switch (not shown) to move the lift member 17 slightly upwardly from its normal position. At the same time, the endless belts 25 are driven to feed the wafer 3 to the end portion of the lift member 17.

Next, as the wafer 3 comes to the end portion of the lift member 17, the endless belts 25 are stopped by means of a limit switch (not shown) and the lift member 17 is slightly lowered to the normal position thereof whereupon the wafer 3 is placed on the end portions of the arms 18. Subsequently, the arms 18 are moved to the wafer holding frame 34 and thus the wafer 3 is delivered into the wafer holding frame 34 and to a position in which various portions thereof are engaged in corresponding grooves or slits 35 formed in the rods 34a, 34b, 34c and 34d of the holding frame 34. In this particular case, the wafer holding frame 34 is then in its lowest position, and thus the wafer 3 is held at the highest stage or level of the wafer holding frame 34.

Next, the motor 32 is energized to raise the wafer holding frame 34 by one stage distance or a distance corresponding to a space between adjacent slits 35 of the rods so that the wafer 3 is removed from the end portions of the arm members 18. The arm members 18 are thereafter moved back to the initial position thereof and the device is restored to its normal position.

Thereafter, the left-hand side cassette 8 is lowered by one stage distance and a second wafer 3 is fed out therefrom. The second wafer 3 will then be held in the slits of the second stage or level of the wafer holding frame 34 by a similar operation of the system. In this manner, the wafers 3 are fed one after another into the wafer holding frame 34, and after all the wafers 3 in the left-hand side cassette 8 have been fed into the wafer holding frame 34, the wafers 3 in the right-hand side cassette 8 will then be fed into the wafer holding frame 34 in a similar manner so that all of the wafers (up to 50 wafers in the present embodiment) will be finally fed into the wafer holding frame 34 so as to be held in vertically-spaced relation therein, with each wafer 3 being disposed substantially horizontally.

Thereafter, the motor 32 is energized once again to raise the lid member 29 until it closes the opening at the lower end of the plasma generating chamber 2 to seal up the inside of the chamber 2. The inside of the chamber 2 is then brought into a vacuum condition by operation of a vacuum pump (not shown) and plasma is generated therein in order to effect processing such as etching, cleaning, ashing, etc., of the wafers 3.

After such processing with plasma for a predetermined period of time, the motor 32 is again energized to lower the wafer holding frame 34 until the wafer 3 at the lowest stage or level therein comes to a predetermined position slightly above the upper edges of the arm members 18. Then, the arm members 18 are moved toward the wafer holding frame 34, i.e., in the rearward direction until the end portions thereof are disposed directly below the lowermost wafer 3. The motor 32 is then further energized to lower the wafer holding frame 34 until the wafers 3 are received by the arm members 18, whereafter the wafers 3 are then put into either one of the left-hand and right-hand side cassettes 8 following the reverse sequence. Thereafter, the plasma processing sequence is repeated in a similar manner for the required number of wafers 3. It is to be understood that the sequence of operations as described hereinabove is attained by means of a fully automatic or semi-automatic control system (not shown).

It is to be noted that the foregoing description relates to one particular embodiment of the present invention and that the present invention is not limited to the embodiment illustrated in the drawings and described herein. For example, while the second feeding mechanism 16 of the embodiment shown in the drawings comprises two different kinds of parts including a lift member 17 and two arm members 18, the second feeding mechanism may alternatively be constructed of a single part which is mounted for up and down movement and also for movement towards the wafer holding frame 34.

Also, while in the foregoing description each of the first feeding mechanisms comprises a pair of parallel movable endless belts, it may alternatively be constructed of a single belt having a greater width and a wafer may be fed out by means of a pivotal member. Further, the lifting mechanism may include a combination of a motor and a rod instead of a cylinder.

Further, in the above-described embodiment of the present invention, the automatic plasma processing device may be provided in the form of a treatment device which has, instead of the plasma generating and heating mechanism including the plasma processing chamber, a treatment mechanism of any conventional type adapted for treatments including at least heating. In such event, it is preferable to provide a fan above a heat treatment chamber in the body of the device, so as to heat the chamber evenly.

Although there have been described what are at present considered to be the preferred embodiments of the invention, it will be understood that the invention may be embodied in other specific forms without departing from the spirit or essential characteristics thereof. The present embodiments are therefore to be considered in all respects as illustrative, and not restrictive. The scope of the invention is indicated by the appended claims rather than by the foregoing description.

We claim:

1. An automatic plasma processing device, comprising:
   at least one cassette member adapted to contain a plurality of semiconductor wafers therein;
   feeding means for taking out said wafers one by one from said cassette member and for feeding the same;
   a holding member operable for receiving said wafers one by one from said feeding means and for holding a plurality of said wafers therein in a predetermined spaced relation in substantially the vertical direction, with each said wafer being disposed horizontally;
   said holding member including a bottom plate, and a plurality of substantially vertical bars each having a lower portion thereof fixed to said bottom plate and grooves or slits formed in a vertical column therein, such that associated sets of grooves of said vertical bars may each receive therein peripheral portions of a wafer;
   driving means for driving said holding member to move in a substantially vertical direction;
   a plasma chamber disposed in a substantially vertical direction such that said holding member may be moved substantially in the vertical direction into and out of said plasma chamber;
   plasma generating means for generating plasma in said plasma chamber in order to effect plasma processing of said wafers with the plasma generated thereby; and control means for controlling said feeding means, said driving means and said plasma generating means in accordance with a predetermined sequence.

2. An automatic plasma processing device according to claim 1, wherein:

said feeding means is also operable to take said wafers after completion of the processing one by one from said holding member and to feed said wafers back to said cassette member one by one.

3. An automatic plasma processing device according to claim 1 or 2, wherein:

said feeding means includes at least one first feeding mechanism for receiving said wafers from and delivering said wafers to said cassette member, and a second feeding mechanism for receiving said wafers from and delivering said wafers to said first feeding mechanism and said holding member.

4. An automatic plasma processing device according to claim 3, wherein:

said cassette member includes a pair of substantially vertical parallel plates fixed relative to each other;

a plurality of ribs are formed in a predetermined spaced relationship in a substantially vertical direction on each of opposing ones of surfaces of said parallel plates such that a wafer may be received at peripheral portions thereof on opposing ones of said ribs of said parallel plates; and said first feeding mechanism includes a lifting mechanism for positioning said cassette member substantially in the vertical direction, and a conveyor mechanism extending between said parallel plates of said cassette member.

5. An automatic plasma processing device according to claim 4, wherein:

at least one pair of said cassette members is provided; and at least one pair of said feeding mechanisms is provided, each operable for receiving said wafers from and delivering said wafers to either one of said cassette members and for individually receiving said wafers from and delivering said wafers to said second feeding mechanism.

6. An automatic plasma processing device according to claim 3, wherein:

said second feeding mechanism includes:

a substantially vertically movable member having an elongated horizontal top face which has one end disposed adjacent said first feeding mechanism and the opposite end opposed to said holding member;

a lifting mechanism operable for positioning said vertically movable member substantially in the vertical direction;

a pair of conveyor mechanisms mounted on opposite sides of said horizontal top face of said vertically movable member and operatively cooperative to feed a wafer in a substantially horizontal direction;

a pair of substantially horizontally movable members disposed on opposite sides of said horizontal top face of said vertically movable member and operatively cooperative to hold a wafer thereon and reciprocally movable to said holding member; and a driving mechanism operable to position said horizontally movable member substantially in the horizontal direction.

7. An automatic plasma processing device according to claim 3, wherein:

said second feeding mechanism feeds a wafer into said holding member in a substantially horizontal direction;

said plurality of vertical bars comprises four substantially vertical parallel bars having lower ends thereof fixed to said bottom plate; and each said associated set of grooves comprises four associated grooves of said four parallel bars.

8. An automatic plasma processing device according to claim 7, wherein:

a pair of said four parallel bars are disposed adjacent said second feeding mechanism and are spaced from each other by a relatively great distance while the other pair of said four parallel bars are disposed remote from said second feeding mechanism and are spaced from each other by a relatively small distance.

9. An automatic plasma processing device according to claim 7, wherein:

said plasma chamber has an opening which is open downwardly; and said bottom plate of said holding member is operable to close said opening of said plasma chamber.

10. An automatic plasma processing device according to claim 1, wherein:

said plasma chamber is substantially in the form of a cylinder which has a substantially vertical axis.

11. An automatic plasma processing device according to claim 1, further comprising:

heating means for heating said plasma chamber from the outside, said heating means being controlled by said control means.

12. A heat treatment device, comprising:

at least one cassette member adapted to contain therein a plurality of thin plate-like works to be treated;

feeding means for taking out said works one by one from said cassette member and for feeding the same;

a holding member operable for receiving said works one by one from said feeding means and for holding therein a plurality of said works in a predetermined spaced relation in substantially the vertical direction, with each said work being disposed horizontally;

driving means for driving said holding member to move in a substantially vertical direction;

a heat treatment chamber disposed in a substantially vertical direction such that said holding member may be moved in the vertical direction into and out of said heat treatment chamber;

said heat treatment chamber being adapted for a treatment including at least the heating of said works; and heating means for heating said heat treatment chamber from the outside.

13. An automatic heat treatment device for sheet-like treatment objects, comprising:

a treatment chamber disposed such that an axis thereof extends in a substantially vertical direction;

heating means disposed on an outer periphery of said treatment chamber; and a holding member for holding a plurality of said sheet-like treatment objects in a predetermined spaced relation in a substantially vertical column with each said object being disposed horizontally, said holding member being adapted to move in substantially a vertical direction between a first predetermined position in which said objects are loaded therein and unloaded therefrom, and a second predetermined position in which said objects are heat-treated in said treatment chamber.

14. An automatic heat treatment device according to claim 13, wherein:
said heating means comprises a high-frequency inductive heating coil.

15. An automatic heat treatment device according to claim 13, wherein:
said heating means comprises a resistance heating coil.

16. An automatic heat treatment device according to claim 13, wherein:
said heating means comprises a heating lamp.

17. An automatic heat treatment device according to claim 13, wherein:
said treatment chamber is substantially cylindrical and opening downwardly; and
said holding member is moved substantially in the vertical direction into and out of said treatment chamber through said opening.

* * * * *